United States Patent
Hayashi (10) Patent No.: US 9,190,588 B2
(45) Date of Patent: Nov. 17, 2015

(54) SIDE-VIEW TYPE LIGHT EMITTING APPARATUS AND PACKAGE

(71) Applicant: NICHIA CORPORATION, Tokushima (JP)

(72) Inventor: Masaki Hayashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/313,492

(22) Filed: Jun. 24, 2014

(65) Prior Publication Data

US 2014/0306262 A1 Oct. 16, 2014

Related U.S. Application Data

(63) Continuation of application No. 12/003,667, filed on Dec. 28, 2007, now Pat. No. 8,802,459.

(30) Foreign Application Priority Data

Dec. 28, 2006 (JP) ................................. 2006-355092

(51) Int. Cl.
*H01L 33/62* (2010.01)
*B29C 45/14* (2006.01)
(Continued)

(52) U.S. Cl.
CPC .......... *H01L 33/62* (2013.01); *B29C 45/14467* (2013.01); *B29C 45/14655* (2013.01); *B29C 45/1671* (2013.01); *H01L 33/486* (2013.01); *B29C 45/0013* (2013.01); *H01L 33/52* (2013.01); *H01L 33/54* (2013.01); *H01L 2224/48091* (2013.01); *H01L 2224/48247* (2013.01); *H01L 2924/0102* (2013.01); *H01L 2924/01012* (2013.01); *H01L 2924/01025* (2013.01); *H01L 2924/01057* (2013.01); *H01L 2924/01063* (2013.01); *H01L 2924/01066* (2013.01); *H01L 2924/01078* (2013.01); *H01L 2924/01079* (2013.01); *H01L 2924/3025* (2013.01)

(58) Field of Classification Search
CPC ............................. H01L 33/486; H01L 33/56
See application file for complete search history.

(56) References Cited

U.S. PATENT DOCUMENTS 5,079,190 A 1/1992 Mihara
5,371,044 A 12/1994 Yoshida et al.
(Continued)

FOREIGN PATENT DOCUMENTS

JP 02-268471 A 11/1990
JP 07-176793 A 7/1995
(Continued)

OTHER PUBLICATIONS

Notification of Reasons for Rejection dated Jan. 8, 2013, corresponding to Japanese Patent Application No. 2006-355092.
(Continued)

*Primary Examiner* — Allen Parker
(74) *Attorney, Agent, or Firm* — Squire Patton Boggs (US) LLP (57) ABSTRACT

A surface mount lateral light emitting apparatus, which includes a light emitting device; a first lead frame connected to the light emitting device; a second lead frame connected to the light emitting device; a first resin molding body in which a concave portion for mounting the light emitting device is formed and the first lead frame and the second lead frame are fixed; and a second resin molding body which covers the light emitting device to form a light emitting surface in the concave portion of the first resin molding body, wherein the first resin molding body contains a filler or a light diffusion agent; wherein in a periphery of the concave portion, a width of at least one side of the first resin molding body is not more than 0.2 mm; and wherein the first resin molding body and the second resin molding body are formed with a thermosetting resin.

15 Claims, 2 Drawing Sheets

(51) Int. Cl.
  *B29C 45/16* (2006.01)
  *H01L 33/48* (2010.01)
  *B29C 45/00* (2006.01)
  *H01L 33/52* (2010.01)
  *H01L 33/54* (2010.01)

(56) References Cited

U.S. PATENT DOCUMENTS

| | | | |
|---|---|---|---|
| 5,742,098 | A | 4/1998 | Brunner |
| 5,883,424 | A | 3/1999 | Tanaka |
| 6,066,861 | A | 5/2000 | Hohn et al. |
| 6,097,101 | A | 8/2000 | Sato et al. |
| 6,142,677 | A | 11/2000 | Sato et al. |
| D478,877 | S | 8/2003 | Hoshiba |
| 6,680,490 | B2 * | 1/2004 | Yasukawa et al. ............ 257/98 |
| 6,712,529 | B2 | 3/2004 | Horio |
| 6,803,606 | B2 | 10/2004 | Takenaka |
| 6,809,261 | B1 | 10/2004 | Ng et al. |
| 6,882,820 | B2 | 4/2005 | Shinshi et al. |
| 7,009,285 | B2 | 3/2006 | Su et al. |
| 7,012,277 | B2 | 3/2006 | Takenaka |
| D526,971 | S | 8/2006 | Inoue |
| 7,127,204 | B2 | 10/2006 | Satoh et al. |
| 7,239,838 | B2 | 7/2007 | Sato et al. |
| 7,242,897 | B2 | 7/2007 | Satoh et al. |
| 7,279,719 | B2 | 10/2007 | Suehiro et al. |
| 7,347,603 | B2 | 3/2008 | Ikeda et al. |
| 7,507,682 | B2 | 3/2009 | Takase et al. |
| 2002/0145152 | A1 | 10/2002 | Shimomura |
| 2002/0163006 | A1 * | 11/2002 | Yoganandan et al. ......... 257/81 |
| 2003/0080341 | A1 | 5/2003 | Sakano et al. |
| 2004/0013453 | A1 | 1/2004 | Shinshi et al. |
| 2004/0159850 | A1 | 8/2004 | Takenaka |
| 2004/0160187 | A1 | 8/2004 | Yao |
| 2005/0127816 | A1 | 6/2005 | Sumitani |
| 2005/0163543 | A1 | 7/2005 | Satoh et al. |
| 2005/0211991 | A1 | 9/2005 | Mori et al. |
| 2005/0280017 | A1 | 12/2005 | Oshio et al. |
| 2006/0002737 | A1 | 1/2006 | Shinshi |
| 2006/0023451 | A1 | 2/2006 | Han et al. |
| 2006/0116230 | A1 | 6/2006 | Satoh et al. |
| 2006/0165429 | A1 | 7/2006 | Satoh et al. |
| 2006/0192224 | A1 * | 8/2006 | Ono ........................... 257/99 |
| 2006/0193121 | A1 | 8/2006 | Kamoshita |
| 2007/0003334 | A1 | 1/2007 | Shinshi et al. |
| 2007/0014603 | A1 | 1/2007 | Satoh et al. |
| 2007/0059003 | A1 | 3/2007 | Shinshi et al. |
| 2007/0059071 | A1 | 3/2007 | Shinshi et al. |
| 2007/0110464 | A1 | 5/2007 | Nakayama et al. |
| 2007/0166085 | A1 | 7/2007 | Shinshi |
| 2007/0292175 | A1 | 12/2007 | Shinshi |

FOREIGN PATENT DOCUMENTS

| | | |
|---|---|---|
| JP | 09-213855 A | 8/1997 |
| JP | 09-318842 A | 12/1997 |
| JP | 10-144965 A | 5/1998 |
| JP | 11-045958 A | 2/1999 |
| JP | 11-087780 A | 3/1999 |
| JP | 11-177136 A | 7/1999 |
| JP | 11-284101 A | 10/1999 |
| JP | 11-327331 A | 11/1999 |
| JP | 2001-083822 A | 3/2001 |
| JP | 2001-177160 A | 6/2001 |
| JP | 2002-075603 A | 3/2002 |
| JP | 2002-176184 A | 6/2002 |
| JP | 2002-252373 A | 9/2002 |
| JP | 2002-314100 A | 10/2002 |
| JP | 2005-311735 A | 10/2002 |
| JP | 2002-344030 A | 11/2002 |
| JP | 2003-124529 A | 4/2003 |
| JP | 2003-133656 A | 5/2003 |
| JP | 2003-163380 A | 6/2003 |
| JP | 2003-188421 A | 7/2003 |
| JP | 2003-224305 A | 8/2003 |
| JP | 2003-227969 A | 8/2003 |
| JP | 2003-234511 A | 8/2003 |
| JP | 2003-282948 A | 10/2003 |
| JP | 2003-298117 A | 10/2003 |
| JP | 2003-347447 A | 12/2003 |
| JP | 2004-063494 A | 2/2004 |
| JP | 2004-111937 A | 4/2004 |
| JP | 2004-146411 A | 5/2004 |
| JP | 2004-172579 A | 6/2004 |
| JP | 2004-193537 A | 7/2004 |
| JP | 2004-207621 A | 7/2004 |
| JP | 2004-207688 A | 7/2004 |
| JP | 2004-214436 A | 7/2004 |
| JP | 2004-228239 A | 8/2004 |
| JP | 2004-228400 A | 8/2004 |
| JP | 2004-266124 A | 9/2004 |
| JP | 2004-274027 A | 9/2004 |
| JP | 2004-342781 A | 12/2004 |
| JP | 2005-019985 A | 1/2005 |
| JP | 2005-039100 A | 2/2005 |
| JP | 2005-136379 A | 5/2005 |
| JP | 2005-146191 A | 6/2005 |
| JP | 2005-259972 A | 9/2005 |
| JP | 2005-277331 A | 10/2005 |
| JP | 2005-285899 A | 10/2005 |
| JP | 2005-294736 A | 10/2005 |
| JP | 2005-353914 A | 12/2005 |
| JP | 2006-049442 A | 2/2006 |
| JP | 2006-049624 A | 2/2006 |
| JP | 2006-093486 A | 4/2006 |
| JP | 2006-093697 A | 4/2006 |
| JP | 2003-179269 A | 6/2006 |
| JP | 2006-140207 A | 6/2006 |
| JP | 2006-156704 A | 6/2006 |
| JP | 2006-222248 A | 8/2006 |
| JP | 2006-222382 A | 8/2006 |
| JP | 10-214926 A | 11/2008 |

OTHER PUBLICATIONS

Office Action dated Sep. 13, 2011, issued from the Japanese Patent Office on corresponding Application No. Jp 2006-355092.
Notification of Reason for Refusal corresponding to Japanese Patent Application No. 2006-355092 dated May 22, 2012.

* cited by examiner

SIDE-VIEW TYPE LIGHT EMITTING APPARATUS AND PACKAGE

CROSS REFERENCE TO RELATED APPLICATIONS

This application is a continuation application of U.S. application Ser. No. 12/003,667, filed on Dec. 28, 2007, which claims the foreign priority benefit under Title 35, United States Code, §119(a)-(d) of Japanese Patent Application No. 2006-355092, filed on Dec. 28, 2006, the contents of which are hereby incorporated by reference.

BACKGROUND OF THE INVENTION

1. Field of the Invention

The present invention relates to a surface mount lateral light emitting apparatus (side-view type light emitting apparatus) which is used for, for example, alighting apparatus, a display, a backlight of a cellular phone, a video auxiliary light source, and other general consumer light sources, and a fabrication method of the surface mount lateral light emitting apparatus.

2. Description of Related Art

A surface mount lateral light emitting apparatus which usually uses, for example, a light emitting diode (LED) is small and excellent in power efficiency, and emits a brilliant color. In addition, since the light emitting device is a semiconductor device, there is no concern about a blowout of the device. Further, the light emitting device is excellent in an initial drive performance and robust against vibrations and repeat of ON and OFF of the device. Since the light emitting device has the excellent characteristics described above, a light emitting apparatus using a light emitting device such as a LED and a laser diode (LD) has been utilized as various kinds of light sources.

The surface mount lateral light emitting apparatus includes a light emitting device, a mounting lead frame for mounting the light emitting device, a connecting lead frame to be connected to the light emitting device through a lead wire, a resin molding body (first resin molding body) covering most of each lead frame, and a translucent encapsulation resin (second resin molding body) for covering the light emitting device. This is disclosed in, for example, Japanese Patent Laid-open Publication No. 2005-259972. A concave housing portion is disposed on a light emitting surface formed on the first resin molding body, and the light emitting device is mounted on the mounting lead frame arranged in the concave housing portion. A translucent encapsulation resin, in which a fluorescent material is dispersed, is filled in the concave housing portion after an electrode of the light emitting device is connected to the connecting lead frame through the lead wire.

There are two types of surface mount light emitting apparatus, that is, a surface light emitting type (top-view type) and a lateral light emitting type (side-view type).

A constitution of the side-view type light emitting apparatus is basically identical to that of the top-view type light emitting apparatus except for arrangements of lead frames. A lead frame which is electrically connected to the light emitting device and projected outside the package is bended so that an end of the lead frame is on a plane identical to the package side face, which is parallel to an outgoing direction of the light.

It is noted that the side-view type light emitting apparatus is required to be ON at all times and has a stable light intensity since the apparatus is used for a backlight of a notebook PC.

Generally, a major molding method of a resin molding body which provides a less expensive high power surface mount light emitting apparatus has been injection molding of a thermoplastic resin because of its high productivity and thermoplastic property. The side-view type light emitting apparatus has also been molded by a similar manner. This is disclosed in, for example, Japanese Patent Laid-open Publication No. H11-45958 (see FIG. 5).

In the side-view type light emitting apparatus, when a width of a periphery portion of the concave portion is made thinner, a molding of the resin molding body by the injection molding using the thermoplastic resin has been difficult due to a low fluidity of the thermoplastic resin. In addition, when a temperature of the molding is increased for improving the fluidity of the thermoplastic resin, a trouble that a die can not be released from the resin has happened.

Considering the trouble described above, a technology which uses a thermosetting resin instead of the thermoplastic resin for the resin molding body has been developed. This is disclosed in, for example, the Japanese Patent Laid-open Publication No. 2005-259972.

It is noted that when the resin molding body is mass-produced by the injection molding, conventionally, the resin is filled and injected in a first die of a plurality of dies which are arranged in series, and the resin is sequentially filled in the adjacent die. In the resin molding body of the side-view type light emitting apparatus, a portion where the resin is filled and injected is the periphery portion of the concave portion. This is disclosed in, for example, the Japanese Patent Laid-open Publication No. H11-45958.

However, in recent years, a notebook PC is required more reduction in size, weight, and cost. Therefore, a light emitting apparatus to be installed in the notebook PC is also required reduction in size, weight, and cost.

In addition, since the die is released from the resin by pushing a portion where the resin is filled and injected after the injected thermoplastic resin is hardened, the resin molding body is required to have a strength resistant to the pushing. Therefore, there has been a limitation for thinning a width of the periphery portion of the concave portion. Specifically, if the width of the periphery portion of the concave portion is too thinned, a light from a light emitting device entirely passes through the periphery portion, thereby resulting in lowering of light extraction efficiency on a light emitting surface. On the other hand, if the thin periphery portion of the concave portion contains too much a light diffusion agent for increasing the light extraction efficiency on the light emitting surface, a fluidity of the thermoplastic resin forming the thin periphery portion is reduced, thereby resulting in difficulty in molding a thin periphery portion of the concave portion.

In addition, even if the thermoplastic resin is merely replaced by a thermosetting resin, a molding of the thin periphery portion (after hardening of the resin) of the concave portion in the side-view type light emitting apparatus and a molding of a complex shape posed by thinning the apparatus are difficult. Therefore, it has been required to select, for example, a proper thermoplastic resin and process.

It is, therefore, an object of the present invention to provide a small, light, and less expensive side-view type light emitting apparatus and a fabrication method of the apparatus.

SUMMARY OF THE INVENTION

According to a first aspect of the present invention, there is provided a side-view type light emitting apparatus, which includes: a light emitting device; a first lead frame to be electrically connected to the light emitting device; a second lead frame to be electrically connected to the light emitting device; a first resin molding body in which a concave portion for mounting the light emitting device is formed and the first lead frame and the second lead frame are fixed; and a second resin molding body which covers the light emitting device to form a light emitting surface in the concave portion of the first resin molding body, wherein the first resin molding body contains a filler or a light diffusion agent; wherein in a periphery of the concave portion, which is a periphery of the light emitting surface, a width of a straight portion of at least one side of the first resin molding body is not more than 0.2 mm; and wherein the first resin molding body and the second resin molding body are formed with a thermosetting resin.

It is preferable that a thermosetting resin according to the present invention is epoxy resin. Especially, the epoxy resin which is reactive and has no unsaturated bond is preferable, rather than that having the unsaturated bond, such as aromatic epoxy resin, because the epoxy resin having the unsaturated bond may be oxidized and a double bond in the resin may be disconnected by irradiation with a light having a short wavelength and heating, to cause yellow discoloration and degradation.

Epoxy resin containing triazine derivative epoxy resin is further preferable as the epoxy resin of the present invention.

Since the triazine derivative epoxy resin is hardened in a short time, a remaining of unreacted portion due to a shortage of curing agent is suppressed even if a volatile curing agent such as acid anhydride is used. In addition, it is further preferable that the triazine derivative epoxy resin is solid (for example, powder) at a room temperature before hardening, thereby assists to disperse a fluorescent material into the resin, and to be transparent after the hardening. In addition, the epoxy resin may be designed as needed depending on the application. For example, the epoxy resin may be mixed with a filler and light diffusion agent so that a light emitted from a light emitting device is uniformly output mainly in front and lateral directions. In addition, the epoxy resin may be mixed with white pigments such as barium titanate, titanium oxide, alumina, and silicon oxide, rather than dark pigments, for reducing absorption of the light. As described above, the epoxy resin may be mixed with at least one selected from a group of the filler, light diffusion agent, pigment, fluorescent material, reflective material, light shielding material, and light stabilizer, for giving a predetermined function.

With the constitution described above, a resin molding body having a thinner periphery of the concave portion can be molded for the side-view type light emitting apparatus by using a thermosetting resin having a high fluidity.

Therefore, a light emitting apparatus which is excellent in optical characteristics and reliability can be obtained by suppressing insufficient hardening of the resin and sedimentation of the fluorescent material. Accordingly, the side-view type light emitting apparatus which is excellent in, for example, heat resistance and light resistance can be provided.

In addition, the first resin molding body and the second resin molding body can be prevented from peeling off at an interface between the first and the second molding bodies by using a thermosetting resin for both the first and the second molding bodies.

Since a thermosetting resin has many reactive functional groups on its surface different from a thermoplastic resin, a strong adhesive interface can be formed between the first resin molding body and the second resin molding body. Because of the strong adhesion interface, a peeling off at the interface due to thermal expansion and contraction of the resin of the second molding body can be prevented even if the second resin molding body is molded with, for example, silicone resin or modified silicone resin, which has a large thermal expansion coefficient.

Figure 1A:
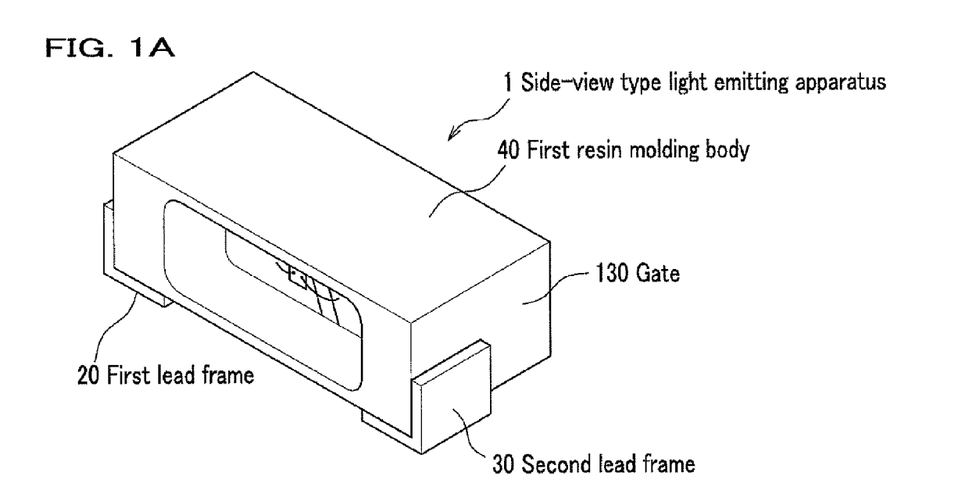
FIG. 1A is a perspective view showing a whole side-view type light emitting apparatus according to an embodiment of the present invention.
Figure 1B:
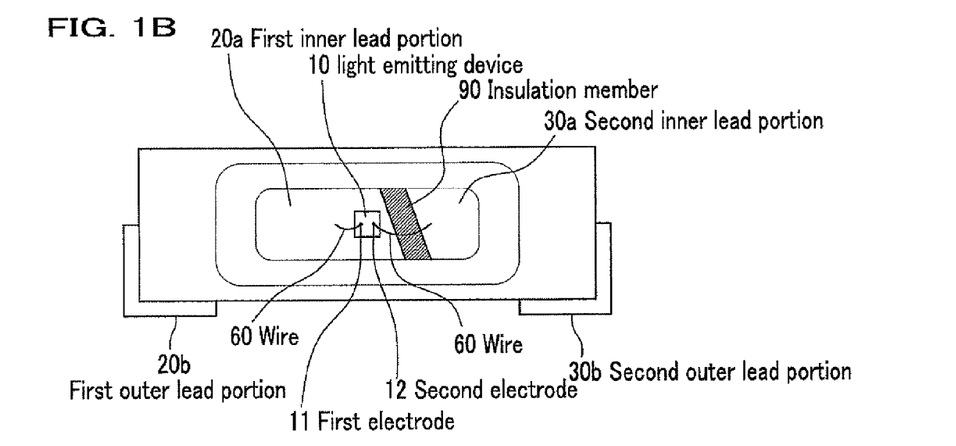
FIG. 1B is a front view of the side-view type light emitting apparatus according to the embodiment as seen from an opening side of the side-view type light emitting apparatus.
Figure 1C:
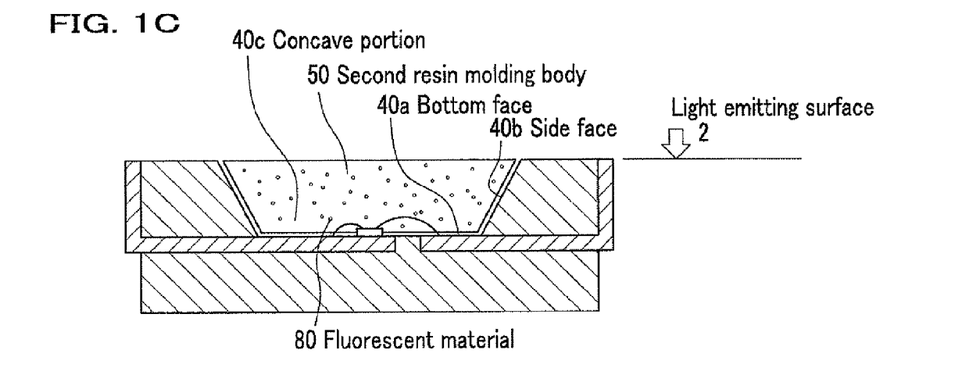
FIG. 1C is a cross sectional view of the side-view type light emitting apparatus according to the embodiment as seen from above of the side-view type light emitting apparatus in FIG. 1B.

On the other hand, the gate is arranged in a thick protection wall portion of the periphery, which is a surrounding area of the light emitting surface 2 as shown in FIG. 1C, of the concave portion 40c. Therefore, an arrangement of the gate and weld line, which are likely to cause a stress cracking, in a thin wall portion such as a thickness of 0.2 mm is unnecessary. As a result, the package can be prevented from cracking even if a thermosetting resin having a large thermal expansion coefficient repeats thermal expansions and contractions.

In addition, a composition of the thermosetting resin can be easily changed without losing heat resistance by three dimensional bridge formations through the hardening. Therefore, a resin molding body for the side-view type light emitting apparatus which is excellent in light and heat resistances can be obtained by easily excluding an aromatic component, which has a poor light resistance, by selecting an appropriate composition of the thermosetting resin.

It is preferable that a resin molding body according to the present invention is molded by a transfer molding process, which will be described later.

A complex shape which is unable to mold by the injection molding can be molded by the transfer molding process using a thermosetting resin having a high fluidity. Especially, the first resin molding body having an extremely narrow housing periphery (not more than 0.2 mm) described above can be easily molded. Accordingly, the resin molding body which is excellent in, for example, mass-production, heat resistance, light resistance, and adhesiveness can be fabricated.

Further, the arrangement of the gate and weld line, which are likely to cause a stress cracking, in the thin wall portion such as the thickness of 0.2 mm are unnecessary, by arranging the gate in the thick protection wall portion of the periphery, which is the surrounding area of the light emitting surface 2 as shown in FIG. 1C, of the concave portion 40c. Therefore, the package can be prevented from cracking even if a thermosetting resin which has a large thermal expansion coefficient repeats thermal expansions and contractions.

In addition, according to a second aspect of the present invention, there is provided a fabrication method of a surface mount lateral light emitting apparatus, which includes steps of: a first step for sandwiching the first lead frame and the second lead frame by an upper die having a convex portion corresponding to the concave portion of the first resin molding body and a lower die to be used in pairs together with the upper die; a second step for injecting a thermosetting resin containing a filler or a light diffusion agent into a space between the upper die and the lower die when the upper die is engaged with the lower die from a gate disposed on a side face of the first resin molding body adjacent to a side face of the concave portion of the first resin molding body; a third step for heating up the injected thermosetting resin to mold the first resin molding body; a fourth step for mounting the light emitting device on the first lead frame under the condition that at least the upper die is released from the injected thermosetting resin, and for electrically connecting a first electrode of the light emitting device to the first lead frame and a second electrode of the light emitting device to the second lead frame; a fifth step for filling the thermosetting resin in the concave portion where the light emitting device is mounted; and a sixth step for heating up the filled thermosetting resin to mold a second resin molding body.

In the fabrication method of the side-view type light emitting apparatus, the thermosetting resin is injected in a space formed by the upper die and lower die by the transfer molding process from the gate disposed on the side face of the first resin molding body adjacent to the side face of the concave portion of the first resin molding body when the upper die is engaged with the lower die. Therefore, a stress is not applied to the thin periphery portion of the concave portion of the first resin molding body when the die is released from the resin, as well as a good resin flow is achieved. Accordingly, the resin molding body which has a thinner periphery portion of the concave portion for the side-view type light emitting apparatus can be provided.

With the fabrication method described above, the side-view type light emitting apparatus which is excellent in mass-productivity, molding, heat resistance, and light resistance can be fabricated.

The side-view type light emitting apparatus according to the present invention can be reduced in size and weight by thinning a width of the periphery portion of the concave portion in the resin molding body. Therefore, a less expensive side-view type light emitting apparatus can be provided by a reduction of resin consumption used for the apparatus.

The triagene derivative epoxy resin, which is a thermosetting resin, is selected in the fabrication method of the side-view type light emitting apparatus according to the present invention. Therefore, the resin molding body having a thin and complex shape in the periphery of the concave portion can be fabricated by increasing the fluidity of the resin. Accordingly, the side-view type light emitting apparatus, which is reduced in size and weight and has a high quality, can be fabricated.

A positional limitation for pressing the resin molding body when the die is released from the resin has been eliminated by selecting the transfer molding process using a thermosetting resin in the fabrication method of the side-view type light emitting apparatus according to the present invention. In addition, a resin injection gate of the die is formed in a shape so that the resin flows easily. Therefore, the resin molding body having the thin and complex shape in the periphery of the concave portion can be fabricated. Accordingly, the side-view type light emitting apparatus, which is reduced in size and weight and has a high quality, can be fabricated.

DETAILED DESCRIPTION OF THE PREFERRED EMBODIMENT

Hereinafter, an embodiment of a side-view type light emitting apparatus according to the present invention and a fabrication method of the apparatus will be explained by referring to drawings. However, the present invention is not limited to the embodiment.

A perspective view of the whole side-view type light emitting apparatus is shown in FIG. 1A. A front view of the side-view type light emitting apparatus as seen from an opening side of the apparatus is shown in FIG. 1B. A cross sectional view of the side-view type light emitting apparatus as seen from above of the apparatus shown in FIG. 1B is shown in FIG. 1C.

It is noted that in FIG. 1A and FIG. 1B, for example, a second resin molding body, which will be described later for explanations, will be omitted.

The side-view type light emitting apparatus according to the embodiment includes a light emitting device 10, a first resin molding body 40 for mounting the light emitting device 10, and a second resin molding body 50 for covering the light emitting device 10. The first resin molding body 40 is integrally molded with a first lead frame 20 for mounting the light emitting device 10 and a second lead frame 30 to be electrically connected to the light emitting device 10, and forms a portion of a package.

It is noted that in the explanation hereinafter, a side of the first resin molding body 40, on which the light emitting device 10 is mounted, is called a light emitting surface 2 or a major face side and the opposite side is called a backside. A side of the first resin molding body 40, on which a gate for injecting a resin is disposed, is called a side face (two side faces exist). In addition, one side of the first resin molding body 40 other than the major face side, the backside, and the two side faces is called an upper face side and the opposite side is called a lower face side.

Hereinafter, each component of the side-view type light emitting apparatus according to the present invention will be explained in detail.

<Light Emitting Device>

The light emitting device 10 includes a pair of positive and negative electrodes, that is, a first electrode 11 and a second electrode 12, on a same face side. In the specification, explanations will be made for the light emitting device 10 which has the pair of positive and negative electrodes on the same face side. However, the light emitting device 10 which has the positive and negative electrodes on an upper face side and a lower face side, respectively may also be used. In this case, an electrode on the lower face side of the light emitting device 10 is electrically connected to the first lead frame 20 using an electrically conductive die bonding material without using a wire.

The light emitting device 10 is fabricated using a semiconductor structure which is formed by depositing semiconductors, for example, GaAlN, ZnS, ZnSe, SiC, GaP, GaAlAs, AlN, InN, AlInGaP, InGaN, GaN, and AlInGaN on a substrate as a light emitting layer. A semiconductor device structure is a homostructure, or a heterostructure, or a double heterostructure which has a MIS junction, or a PIN junction, or a PN junction. A wavelength of the emitting light may be varied from ultraviolet to infrared depending on a semiconductor layer material and a degree of mixed crystal of the material.

Considering a use of the light emitting device 10 in the field, it is preferable to use gallium nitride compound semiconductors, which enable a fabrication of a high intensity light emitting device, as the semiconductor material. In addition, it is preferable to use gallium aluminum arsenides or aluminum indium gallium phosphides for obtaining a red light. However, various kinds of semiconductor materials may be used depending on the application.

A plurality of the light emitting devices 10 may be used, and a color mixture in a white display can be improved by a combination of the light emitting devices 10. For example, two green, one blue, and one red light emitting devices 10 may be combined. It is noted that a wavelength of a red light between 610 nm and 700 nm, that of a green light between 495 nm and 565 nm, and that of a blue light between 430 nm and 490 nm are preferable for applying the lights to a full-color light emitting apparatus of a display.

When a mixed-color light of white colors is emitted using the surface mount lateral light emitting apparatus according to the present invention, it is preferable that a wavelength of a light emitting device is not less than 400 nm and not more than 530 nm, and more preferably not less than 420 nm and not more than 490 nm, by considering, for example, a complementary color to a light (wavelength) emitted from a fluorescent material and a degradation of a translucent resin.

It is still more preferable that the wavelength of the light emitting device is not less than 450 nm and not more than 475 nm for improving an excitation and luminance efficiency of a fluorescent material by the light emitting device. It is noted that the light emitting device which has a principal wavelength in an ultraviolet range less than 400 nm or in a shorter wavelength range of a visible light may be used by utilizing materials which are relatively resistant to ultraviolet irradiation.

The light emitting device 10 which has approximately a square shape with a side of 1 mm can be mounted on the surface mount lateral light emitting apparatus, and the light emitting device 10 with a side of, for example, 600 μm and 320 μm also can be mounted on the apparatus.

<First Resin Molding Body>

The first resin molding body 40 has a concave portion 40c which includes a bottom face 40a and a side face 40b. In the first resin molding body 40, the light emitting device 10, the first lead frame 20 for mounting the light emitting device 10, and the second lead frame 30 to be electrically connected to the light emitting device 10 are arranged so that the light emitting device 10 is arranged in the concave portion 40c by disposing the first lead frame 20 adjacent to the second lead frame 30, thereby resulting in formation of a package. A first inner lead portion 20a of the first lead frame 20 forms a part of the bottom face 40a of the concave portion 40c.

A second inner lead portion 30a of the second lead frame 30 also forms a part of the bottom face 40a of the concave portion 40c, and is located apart from the first inner lead portion 20a at a predetermined distance. The light emitting device 10 is mounted on the first inner lead portion 20a, which corresponds to the bottom face 40a of the concave portion 40c.

The first inner lead portion 20a corresponding to the bottom face 40a of the concave portion 40c, the second inner lead portion 30a corresponding to the bottom face 40a of the concave portion 40c, a first outer lead portion 20b, and a second outer lead portion 30b are exposed to the outside of the first resin molding body 40. The first lead frame 20 and second lead frame 30 on the lower side are exposed to the outside of the first resin molding body 40 and bended to side faces of the body 40, thereby the light emitting device 10 can be electrically connected from the side faces of the body 40.

An opening of the concave portion 40c is tapered to become larger in an opening direction. Therefore, a light extraction in a front direction of the apparatus can be increased. Of course, the concave portion 40c can be formed without the taper. In addition, even though it is preferable that a tapered surface is smooth, an irregularity may be formed on the tapered surface for improving adhesion of an interface between the first resin molding body 40 and the second resin molding body 50. It is preferable that a taper angle of the opening of the concave portion 40c is not less than 95 degrees and not more than 150 degrees, and more preferably not less than 100 degrees and not more than 120 degrees when the angle is measured from the bottom face of the concave portion 40c.

An outer shape of the major face side of the first resin molding body 40 is formed in approximately a rectangle in the embodiment. However, the outer shape may also be formed in, for example, an ellipse, a circle, a pentagon, and a hexagon. A periphery shape of the major face side of the concave portion 40c is formed in approximately a rectangle in the embodiment. However, the outer periphery shape may also be formed in, for example, an ellipse, a rectangle, a pentagon, and a hexagon.

In the first resin molding body 40, a thickness W between a periphery of the concave portion 40c on the major face side and the upper face side or the lower face side of the first resin molding body 40 is formed extremely thin, that is, not more than 0.2 mm. The width W may also be formed not more than 0.1 mm.

As described above, the major face side of the light emitting apparatus has a small area for forming a housing portion compared with the upper face side (correspond to a housing portion of the light emitting device in a top-view type light emitting apparatus) of the light emitting apparatus. Therefore, it is necessary that distances between the periphery of the concave housing portion, which is formed on the front side, and the upper face side and the lower face side of the light emitting apparatus are extremely small for securing a larger housing portion.

A material of the first resin molding body 40 is a thermosetting resin. In the embodiment, an epoxy resin containing triazine-derivative epoxy resin is used.

It is noted that the thermosetting resin to be used for the first resin molding body 40 is not limited to the triazine-derivative epoxy resin.

It is preferable that the first resin molding body 40 is formed by at least one thermosetting resin selected from a group of an epoxy resin, modified epoxy resin, silicone resin, modified silicone resin, acrylate resin, and urethane resin. Especially, the epoxy resin, modified epoxy resin, silicone resin, and modified silicone resin are preferable.

It is preferable that a hard resin is used for the first resin molding body 40 since the first resin molding body 40 has a function of a package as described above. In addition, it does not matter whether or not the first resin molding body 40 is translucent. However, the first resin molding body 40 may be designed as needed depending on the application. For example, an amount of light passing through the first resin molding body 40 may be reduced by mixing the first resin molding body 40 with a light shielding material.

On the other hand, the first resin molding body 40 is mixed with a filler and a light diffusion agent so that a light to be emitted from the side-view type light emitting apparatus is uniformly output mainly in a front and a side directions. In addition, the first resin molding body 40 may be mixed with white pigments such as barium titanate, titanium oxide, alumina, and silicon oxide, rather than dark pigments, as well as the filler and the light diffusion agent, for reducing absorption of the light. As described above, the first resin molding body 40 may be mixed with at least one selected from a group of the filler, light diffusion agent, pigment, fluorescent material, reflective material, light shielding material, and light stabilizer, for giving a predetermined function.

<First Lead Frame and Second Lead Frame>

The first lead frame 20 includes the first inner lead portion 20a and the first outer lead portion 20b. The bottom face 40a of the concave portion 40c of the first resin molding body 40 is exposed until the second resin molding body 50 is filled in the concave portion 40c. The light emitting device 10 is mounted on the first inner lead portion 20a. An area of the first inner lead portion 20a is sufficient as long as the light emitting device 10 can be mounted on the area. However, a larger area is preferable in view of, for example, a thermal conductivity, electrical conductivity, and reflection efficiency of the area.

The first inner lead portion 20a is electrically connected to a first electrode 11 of the light emitting device 10 through a wire 60. The first outer lead portion 20b is an exposed portion outside the first resin molding body 40. The first outer lead portion 20b is connected to an external electrode and also has a function for conducting a heat generated by light emitting.

The second lead frame 30 includes the second inner lead portion 30a and the second outer lead portion 30b. The bottom face 40a of the concave portion 40c of the first resin molding body 40 on the second inner lead portion 30a is exposed until the second resin molding body 50 is filled in the concave portion 40c. The second inner lead portion 30b is electrically connected to a second electrode 12 of the light emitting device 10. An area of the second inner lead portion 30a is sufficient as long as the second electrode 12 can be connected. However, a larger area is preferable in view of reflection efficiency of the area.

The first outer lead portion 20b and the second outer lead portion 30b are exposed, and the side-view type light emitting apparatus can be mounted by using the outer lead portions 20b, 30b. In addition, an insulator member 90 which is an electrically insulating material may be thinly coated for preventing the first outer lead portion 20b and the second outer lead portion 30b from being short-circuited by a solder when the first electrode 11 and the second electrode 12 are soldered. For example, an insulating resin may be used for the insulator member 90.

The first lead frame 20 and the second lead frame 30 may be formed with electrically conductive materials, for example, iron, phosphor bronze, and cupper alloys. In addition, metal plating of, for example, silver, gold, aluminum, and cupper may be provided on the surfaces of the first lead frame 20 and the second lead frame 30 for increasing a reflection efficiency of a light emitted from the light emitting device 10.

In addition, it is preferable to make the surfaces of the first lead frame 20 and the second lead frame 30 smooth for increasing the reflection efficiency.

In addition, it is preferable that areas of the first lead frame 20 and the second lead frame 30 are large for increasing heat dissipation. With the large areas described above, a temperature rise of the light emitting device 10 can be effectively suppressed. Therefore, a larger current can be supplied to the light emitting device 10.

In addition, it is preferable that the first lead frame 20 and the second lead frame 30 are thick for increasing the heat dissipation. In this case, the first lead frame 20 and the second lead frame 30 are formed in a predetermined size in a range which does not cause a difficulty in, for example, bending process of the first lead frame 20 and the second lead frame 30.

In addition, deflections of the first lead frame 20 and the second lead frame 30 are reduced by forming the first lead frame 20 and the second lead frame 30 to be thick. Therefore, the light emitting device 10 can be easily mounted.

On the contrary, if the first lead frame 20 and the second lead frame 30 are formed in a thin flat plate, the bending process becomes easy, and the lead frames 20, 30 can be formed in predetermined shapes.

The first lead frame 20 and the second lead frame 30 form a pair of positive and negative electrodes. It is sufficient if there is at least one first lead frame 20 and at least one second lead frame 30, respectively. However, a plurality of the first lead frames and the second lead frames may be formed. In addition, if a plurality of the light emitting devices 10 are mounted on the first lead frame 20, it is required to dispose a plurality of second lead frames 30.

<Second Resin Molding Body>

The second resin molding body 50 is formed for protecting the light emitting device 10 from, for example, an external force, dusts, and moisture of the external environment to effectively emit a light outside, which is emitted from the light emitting device 10. The second resin molding body 50 is formed inside the concave portion 40c of the first resin molding body 40.

Silicone resin or modified silicone resin is used for forming the second resin molding body 50 in the embodiment.

It is noted that a thermosetting resin used for the second resin molding body 50 is not limited to the silicone resin or the modified silicone resin.

In this case, it is preferable that the second resin molding body 50 is formed by at least one thermosetting resin selected from a group of epoxy resin, modified epoxy resin, silicone resin, modified silicone resin, acrylate resin, and urethane resin. Especially, the epoxy resin, modified epoxy resin, silicone resin, and modified silicone resin are preferable. It is preferable that a hard resin is used for the second resin molding body 50 for protecting the light emitting device 10.

In addition, it is preferable that a resin which is excellent in heat resistance, weather resistance, and light resistance is used for the second resin molding body 50. The second resin molding body 50 may be mixed with at least one selected from a group of a filler, light diffusion agent, fluorescent material, and reflective material for giving a predetermined optical function. The second resin molding body 50 may be mixed with the light diffusion agent.

As the specific light diffusion agents, barium titanate, titanium oxide, alumina, and silicon oxide preferably may be used. In addition, the second resin molding body 50 may contain an organic or inorganic color dye or color pigment for cutting light waves except for desired light waves. In addition, the second resin molding body 50 may contain a fluorescent material 80 which absorbs a light emitted from the light emitting device 10 and transforms wavelengths of the light into other wavelengths.

(Fluorescent Material)

The fluorescent material 80 may be usable as long as the fluorescent material 80 absorbs a light emitted from the light emitting device 10 and transforms wavelengths of the light into different wavelengths. For example, it is preferable that the fluorescent material 80 is at least one selected from a group of, for example, nitride fluorescent materials, oxynitride fluorescent materials, and sialon fluorescent materials, all of which are activated mainly by lanthanoid elements such as Eu and Ce, alkaline earth halogen apatite fluorescent materials, alkaline earth metal boric-acid halogen fluorescent materials, alkaline earth metal aluminate fluorescent materials, alkaline earth silicates, alkaline earth sulfides, alkaline earth thiogallates, alkaline earth silicon nitrides, and germinates, all of which are activated mainly by an element of lanthanoid elements such as Eu and transition metals such as Mn, rare earth aluminate fluorescent materials and rare earth silicates, all of which are activated mainly by an element of lanthanoid elements such as Ce, and organic or inorganic complexes which are activated mainly by lanthanoid elements such as Eu. However, the fluorescent materials are not limited to those described above.

As the nitride fluorescent materials activated mainly by lanthanoid elements such as Eu and Ce, there exist, for example, $M_2Si_5N_8$:Eu and $CaAlSiN_3$:Eu (M is at least one selected from a group of Sr, Ca, Ba, Mg, and Zn). In addition, there exist, for example, $MSi_7N_{10}$:Eu, $M_{1.8}Si_5O_{0.2}N_8$:Eu, and $M_{0.9}Si_7O_{0.1}N_{10}$:Eu (M is at least one selected from a group of Sr, Ca, Ba, Mg, and Zn).

As the oxynitride fluorescent materials activated mainly by lanthanoid elements such as Eu and Ce, there exists, for example, $MSi_2O_2N_2$:Eu (M is at least one selected from a group of Sr, Ca, Ba, Mg, and Zn).

As the sialon fluorescent materials activated mainly by lanthanoid elements such as Eu and Ce, there exists, for example, $M_{p/2}Si_{12-p-q}Al_{p+q}O_qN_{16-p}$:Ce, which is composed of M-Al—Si—O—N (M is at least one selected from a group of Sr, Ca, Ba, Mg, and Zn, q: 0 to 2.5, p: 1.5 to 3).

As the alkaline earth halogen apatite fluorescent materials activated mainly by an element of lanthanoid elements such as Eu and transition metals such as Mn, there exists, for example, $M_5(PO_4)_3X$:R (M is at least one selected from a group of Sr, Ca, Ba, Mg, and Zn. X is at least one selected from a group of F, Cl, Br, and I. R is at least one selected from a group of Eu, Mn, and Eu+Mn.)

As the alkaline earth metal boric-acid halogen fluorescent materials, there exists, for example, $M_2B_5O_9X$:R (M is at least one selected from a group of Sr, Ca, Ba, Mg, and Zn. X is at least one selected from a group of F, Cl, Br, and I. R is at least one selected from a group of Eu, Mn, and Eu+Mn.).

As the alkaline earth metal aluminate fluorescent materials, there exist, for example, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from a group of Eu, Mn, and Eu+Mn.).

As the alkaline earth sulfide fluorescent materials, there exist, for example, $La_2O_2S$:Eu, $Y_2O_2S$:Eu, and $Gd_2O_2S$:Eu.

As the rare earth aluminate fluorescent materials which are activated mainly by an element of lanthanoid elements such as Ce, there exist, for example, YAG fluorescent materials which are expressed with the following compositional formula $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. In addition, there exist, for example, $Tb_3Al_5O_{12}$:Ce and $Lu_3Al_5O_{12}$:Ce, in which a part or all of Y in the YAG fluorescent materials are substituted by, for example, Tb or Lu.

Other than the fluorescent materials described above, there exist, for example, ZnS:Eu, $Zn_2GeO_4$:Mn, and $MGa_2S_4$:Eu (M is at least one selected from a group of Sr, Ca, Ba, Mg, and Zn. X is at least one selected from a group of F, Cl, Br, and I.)

The above fluorescent materials may contain at least one selected from a group of Tb, Cu, Ag, Au, Cr, Nd, Dy, Co, Ni, and Ti instead of Eu or in addition to Eu as needed.

In addition, a fluorescent material 80 other than those described above can be used as long as the fluorescent material 80 has an identical performance and effect to those described above.

A fluorescent material 80 which emits, for example, yellow, red, green, or blue by an excitation light of the light emitting device 10 may be used. In addition, a fluorescent material 80 which emits, for example, yellow-green, blue-green, or orange color, which is an additive color of the above colors, may also be used. By combining these fluorescent materials, a side-view type light emitting apparatus which has various kinds of emission spectra can be fabricated.

For example, the fluorescent material $Y_3Al_5O_{12}$:Ce or $(Y_{0.8}Gd_{0.2})_3Al_5O_{12}$:Ce is irradiated with a blue light emitted from GaN compound semiconductors to transform wavelengths of the blue light. As a result, a side-view type light emitting apparatus which emits a white light, which is a mixed color between the blue light emitted from the light emitting device 10 and a light emitted from the fluorescent material 80, can be provided.

For example, by using a fluorescent material $CaSi_2O_2N_2$:Eu or $SrSi_2O_2N_2$:Eu which emits a green to yellow light, $(Sr, Ca)_5(PO_4)_3Cl$:Eu which emits a blue light, and $(Ca, Sr)_2Si_5N_8$:Eu which emits a red light, a side-view type light emitting apparatus which emits a white light having an excellent color rendering properties can be provided. In this case, since red, blue, and green, that is, three primary colors are used, a desired white light can be obtained by changing compounding ratios among the $CaSi_2O_2N_2$:Eu or $SrSi_2O_2N_2$:Eu, $(Sr, Ca)_5(PO_4)_3Cl$:Eu, and $(Ca, Sr)_2Si_5N_8$:Eu.

<Fabrication Method of Side-View Type Light Emitting Apparatus>

A fabrication method of a side-view type light emitting apparatus according to the present invention will be explained. The fabrication method is used for the side-view type light emitting apparatus described above. FIG. 2A to FIG. 2E are brief cross sectional views showing a fabrication process of a side-view type light emitting apparatus according to a first embodiment.

Figure 2A:
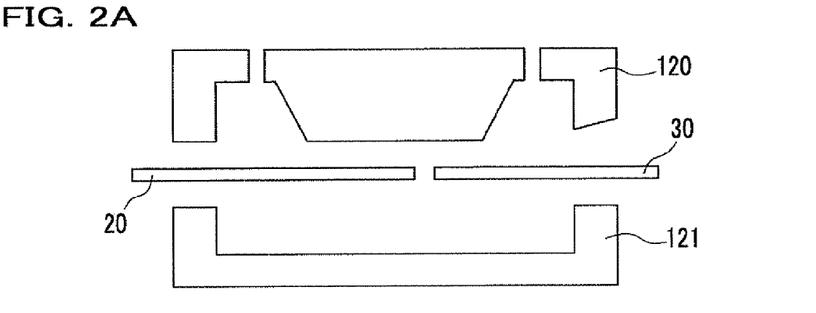
FIGS. 2A, 2B, 2C, 2D, and 2E are cross sectional views showing a fabrication process of a side-view type light emitting apparatus according to the embodiment.
Figure 2B:
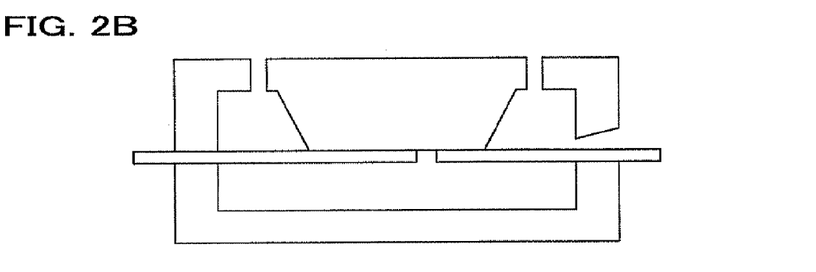

First, the first inner lead portion 20a and the second inner lead portion 30a corresponding to the bottom face 40a of the concave portion 40c of the first resin molding body 40, and the first outer lead portion 20b and the second outer lead portion 30b are sandwiched by an upper die 120 and a lower die 121 (first process: see FIG. 2A, FIG. 2B).

The upper die 120 has a convex portion corresponding to a concave portion of the first resin molding body. A portion of the upper die 120 corresponding to the bottom face 40a of the concave portion 40c of the first resin molding body 40 is formed to come in contact with the first inner lead portion 20a and the second inner lead portion 30a.

Figure 2C:
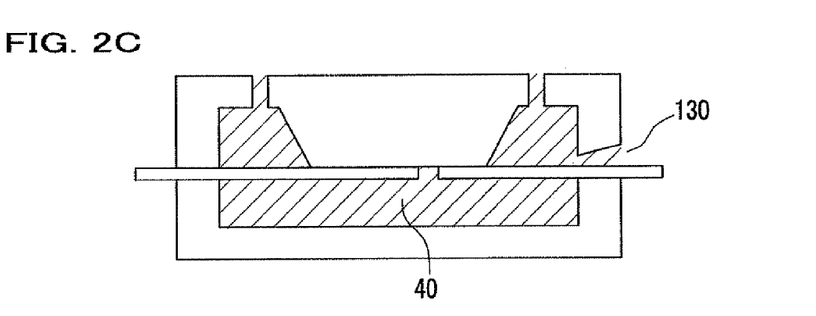

Next, a thermosetting resin is injected into a space formed between the upper die 120 and the lower die 121 by a transfer molding process from a gate 30 disposed on a side face of the first resin molding body 40 adjacent to a side face of the concave portion 40c (second process: see FIG. 2C).

The transfer molding process includes a series of the following steps. A thermosetting resin having a pellet shape with a predetermined size is put in a predetermined container, and pressed to inject the melted thermosetting resin into a concave portion, which is communicated with the container, between the upper die 120 and the lower die 121. The upper die 120 and the lower die 121 are heated up at a predetermined temperature to harden the thermosetting resin injected into the concave portion.

In the transfer molding process, since the first inner lead portion 20a and the second inner lead portion 30a are sandwiched by the upper die 120 and lower die 121, a flip-flop of the first inner lead portion 20a and the second inner lead portion 30a and a generation of burrs can be suppressed when the thermosetting resin is injected.

In addition, since a correct position of the gate 130 is selected in the transfer molding process, the thermosetting resin flows and spreads even in an extremely thin portion, whose width is not more than 0.2 mm and preferably not more than 0.1 mm, between a periphery of the concave portion 40c and the upper face side or lower face side of the first resin molding body 40 on the light emitting surface 2. Accordingly, a stable and uniform first resin molding body 40 can be provided.

The injected thermosetting resin is heated up and hardened to form a package which is excellent in, for example, heat resistance, light resistance, and adhesiveness, including the first resin molding body 40 (third process: see FIG. 2C).

In the next process, the upper die 120 and the lower die 121 are released from the resin for mounting the light emitting device 10. If a hardening of the resin is not sufficient, the hardening process is continued so that the resin has a mechanical strength not to cause any problem in the later working process of the first resin molding body 40.

Next, the light emitting device 10 is mounted on the first inner lead portion 20a. The light emitting device 10 has the first electrode 11 and the second electrode 12. The first electrode 11 is electrically connected to the first inner lead portion 20a and the second electrode 12 is electrically connected to the second inner lead portion 30a (fourth process: see FIG. 2D).

Figure 2D:
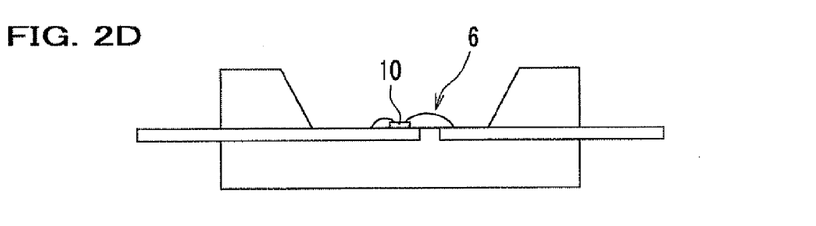

The first electrode 11 is electrically connected to the first inner lead portion 20a through the wire 60 and the second electrode 12 is electrically connected to the second inner lead portion 30a through the wire 60.

Figure 2E:
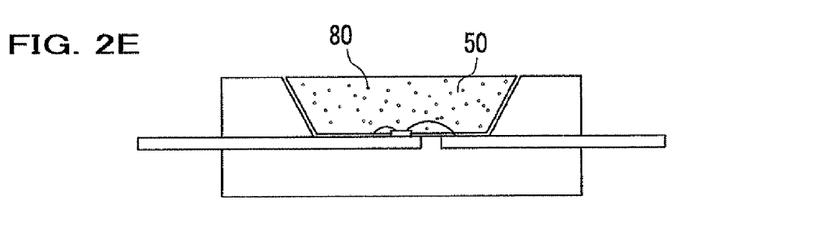

In the next process, a thermosetting resin is filled in the concave portion 40c where the light emitting device 10 is mounted (fifth process: see FIG. 2E).

A dropping means, injection means, or extrusion means may be used for filling the thermosetting resin. However, the dropping means is preferable because a filling method using the dropping means can effectively remove an air remaining in the concave portion 40c. It is preferable that the thermosetting resin is mixed with the fluorescent material 80 because a color tone adjustment of the side-view type light emitting apparatus can be easily implemented by the mixing of the fluorescent material 80.

In the last process, the thermosetting resin is heated up to be hardened to form the second resin molding body 50 (sixth process: see FIG. 2E).

With the processes described above, the side-view type light emitting apparatus can be easily fabricated. In addition, the side-view type light emitting apparatus having a high adhesiveness can be provided by forming the first resin molding body 40 and the second resin molding body 50 using the thermosetting resin.

In addition, the side-view type light emitting apparatus which is excellent in, for example, heat resistance, light resistance, and adhesiveness can be provided, because a peeling off at an interface between the first resin molding body 40 and the second resin molding body 50 does not occur.

What is claimed is:

1. A side-view type light emitting apparatus comprising:
a light emitting device;
a first lead frame to be electrically connected to the light emitting device;
a second lead frame to be electrically connected to the light emitting device;
a first resin molding body having the first lead frame and the second lead frame fixed thereto;
a major face of the first resin molding body including an oblong, ellipse, or rectangular opening of a concave portion and being substantially a rectangle;
first and second short side faces perpendicular to the major face with respective first and second short edges;
first and second long side faces perpendicular to the major face with respective first and second long edges;
a second resin body which covers the light emitting device,
wherein the first and second short edges and the first and second long edges form a perimeter of the major face,
wherein a first width of the major face between the first short edge and the opening of the concave portion is greater than a second width of the major face between the first long edge and the opening of the concave portion,
wherein the first lead frame and the second lead frame are exposed to the opening concave portion of the first resin molding body,
wherein the first lead frame extends from the opening concave portion to the first short side face and has an end portion disposed on the second long side face,
wherein the second lead frame extends from the opening concave portion to the second short side face and has an end portion disposed on the second long side face,
wherein the second long side face is a mounting surface,
wherein the first resin molding body is formed of an epoxy resin containing a triazine derivative epoxy resin.

2. The side-view type light emitting apparatus according to claim 1, wherein the first resin molding body contains a filler or a light diffusion agent.

3. The side-view type light emitting apparatus according to claim 1, wherein the first resin molding body contains a barium titanate, titanium oxide, alumina, or silicon oxide.

4. The side-view type light emitting apparatus according to claim 1, wherein the opening concave portion is tapered to become larger in an opening direction.

5. The side-view type light emitting apparatus according to claim 4, wherein a tapered angle of the opening concave portion is not less than 95 degrees and not more than 150 degrees when the angle is measured from a bottom face of the concave portion.

6. The side-view type light emitting apparatus according to claim 1,
wherein the first lead frame and the second lead frame are towards the second long side face.

7. The side-view type light emitting apparatus according to claim 1,
wherein the second resin body is formed with a thermosetting resin.

8. The side-view type light emitting apparatus according to claim 1,
wherein the second width of the major face between the first long edge and the opening of the concave portion is not more than 0.2 mm.

9. A package comprising:
a pair of lead frames having a first lead frame and a second lead frame;
a first resin molding body having the pair of lead frames fixed thereto;
a major face of the first resin molding body including an oblong, ellipse or rectangular opening of a concave portion and being substantially a rectangle;
first and second short side faces perpendicular to the major face with respective first and second short edges;
first and second long side faces perpendicular to the major face with respective first and second long edges,
wherein the first and second short edges and the first and second long edges form a perimeter of the major face,
wherein a first width of the major face between the first short edge and the opening of the concave portion is greater than a second width of the major face between the first long edge and the opening of the concave portion,
wherein the pair of lead frames is exposed to the opening concave portion of the first resin molding body,
wherein the first lead frame extends from the opening concave portion to an outside of the first short side face and has an end portion disposed on the second long side face,
wherein the second lead frame extends from the opening concave portion to an outside of the second short side face and has an end portion disposed on the second long side face,
wherein the second long side face is a mounting surface, and wherein the first resin molding body is formed of an epoxy resin containing a triazine derivative epoxy resin.

10. The package according to claim 9, wherein the first resin molding body contains a filler or a light diffusion agent.

11. The package according to claim 9, wherein the first resin molding body contains a barium titanate, titanium oxide, alumina, or silicon oxide.

12. The package according to claim 9, wherein the opening concave portion is tapered to become larger in an opening direction.

13. The package according to claim 12, wherein a tapered angle of the opening concave portion is not less than 95 degrees and not more than 150 degrees when the angle is measured from a bottom face of the concave portion.

14. The package according to claim 9,
wherein the first lead frame and the second lead frame are towards the second long side face.

15. The package according to claim 9,
wherein the second width of the major face between the first long edge and the opening of the concave portion is not more than 0.2 mm.

* * * * *